(12) United States Patent
Shinmura

(10) Patent No.: US 6,281,052 B1
(45) Date of Patent: Aug. 28, 2001

(54) METHOD OF MANUFACTURING SEMICONDUCTOR DEVICE

(75) Inventor: Toshiki Shinmura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/553,169

(22) Filed: Apr. 20, 2000

(30) Foreign Application Priority Data

Apr. 27, 1999 (JP) .................................................. 11-119094

(51) Int. Cl.[7] ...................... H01L 21/335; H01L 21/8232
(52) U.S. Cl. ............................................. 438/142; 438/592
(58) Field of Search .................................... 438/142, 289, 438/303, 592, 595, 653, 396, 584, 648, 682, 685

(56) References Cited

U.S. PATENT DOCUMENTS

| 5,254,490 | * | 10/1993 | Kondo ..................................... 437/44 |
| 5,940,725 | * | 8/1999 | Hunter et al. ........................ 438/592 |
| 6,133,127 | * | 10/2000 | Hoshino ................................ 438/584 |
| 6,136,655 | * | 10/2000 | Assadersghi et al. ................ 438/289 |

FOREIGN PATENT DOCUMENTS

| 9-36228 | 2/1997 | (JP) . |
| 9-272972 | 10/1997 | (JP) . |
| 10-294453 | 11/1998 | (JP) . |

* cited by examiner

*Primary Examiner*—David Nelms
*Assistant Examiner*—Phuc T. Dang
(74) *Attorney, Agent, or Firm*—Young & Thompson

(57) ABSTRACT

According to a semiconductor device manufacturing method, the surface of a silicon substrate is defined by an element isolation region, a gate oxide film and a polysilicon film are formed, and then a titanium nitride film is formed on the polysilicon film at a substrate temperature of 400° C. to 600° C. by collimate sputtering. A titanium silicide film is further formed on the titanium nitride film. A stacked film structure constituted by the titanium silicide film, titanium nitride film, and polysilicon film is patterned to form a gate electrode. After that, an LDD side wall is formed. Since the titanium nitride film is formed in this manner by collimate sputtering, a titanium nitride film, with which the breakdown voltage of the gate oxide film is not decreased and which has a high barrier performance, can be realized. When titanium polycide using a titanium nitride barrier is applied to a DRAM, low-resistance word lines can be formed, so that a DRAM having a high degree of integration can be obtained.

18 Claims, 6 Drawing Sheets

US 6,281,052 B1

METHOD OF MANUFACTURING SEMICONDUCTOR DEVICE

BACKGROUND OF THE INVENTION

1. Field of the Invention

The present invention relates to a method of manufacturing a semiconductor device and, more particularly, to a method of manufacturing a semiconductor device, with which a low-resistance, heat-resistant, and highly integrated titanium polycide gate electrode having a gate oxide film with a high breakdown voltage can be obtained.

2. Description of the Prior Art

In an LSI, increases in yield and in number of chips per wafer can be expected by reducing the chip size, so the manufacturing cost is decreased. An increase in the degree of integration has been achieved by reducing the design size and increasing the chip size. In DRAMs of 256 Mbytes or more having a chip size exceeding 200 $mm^2$, it is significant to suppress this increase in chip size.

Attention has been paid on the fact that when the resistance of word lines is decreased, the number of cells per word driver can be increased, and the number of word drivers can accordingly be decreased. For example, assuming that the resistance is ½ and that the number of cells per word driver is increased from 500 to 1,000 in a 1-Gbyte DRAM, the number of word drivers can be decreased by 500,000, so that the chip size can be reduced by about 5%.

Conventionally, in a DRAM, tungsten polycide obtained by stacking tungsten silicide on polysilicon has been widely used. As tungsten polycide has a high resistance, use of titanium polycide having a lower resistance, which is obtained by stacking titanium silicide on polysilicon, is sought for. When titanium polycide is applied to a DRAM, since the manufacturing process of the DRAM includes the step of processing the DRAM at a high temperature, a p- or n-type impurity is diffused from polysilicon to titanium silicide during the high-temperature process. This impurity diffusion degrades the heat resistance of titanium silicide. Then, the resistance increases, and the chip size may not be reduced.

Prevention of impurity diffusion to titanium silicide by intervening a titanium nitride film or the like between a polysilicon film and a titanium silicide film has been proposed, and studies have recently be made on a technique for a titanium polycide gate having a barrier metal.

In the titanium polycide gate, a titanium nitride (TiN) film barrier is formed between the titanium silicide (TiSi) film and the polysilicon (poly-Si) film usually by sputtering, so that impurity diffusion from the polysilicon film to the titanium silicide film is prevented, thereby preventing degradation in heat resistance during annealing.

If, however, the formed titanium nitride film has a low density, a sufficiently high isolation effect cannot be obtained, and the impurity, e.g., phosphorus, contained in polysilicon is sometimes diffused into titanium silicide during annealing. Generally, the section of a titanium nitride film formed by conventional sputtering has a columnar structure. In a low-density film, gaps are found among columns of the columnar structure (e.g., see "Thin Film Fabrication Handbook" issued by KYORITSU SHUPPAN CO., LTD.) It is assumed that the gaps among the columns formed in the titanium nitride film decrease the barrier performance of the titanium nitride film. In order to effectively prevent impurity diffusion from polysilicon to titanium silicide, the titanium nitride film must be imparted with a high barrier performance.

According to conventional ordinary sputtering, a titanium nitride film is formed under the following conditions. For example, the substrate temperature is 300° C., the gas pressure is 3 mTorr, the ratio of Ar flow rate to $N_2$ flow rate is 1:1, and the sputter power is 3 kW.

Meanwhile, it is known that, to increase the density of the titanium nitride film, thus improving the barrier performance, the titanium nitride film is preferably formed at a higher temperature.

Conventionally, the film density of the titanium nitride film formed by conventional ordinary sputtering changes depending on the substrate temperature during film formation. When the titanium nitride film is formed at a high substrate temperature, the density increases. Then, although the barrier performance improves, the breakdown voltage of the gate oxide film decreases.

FIG. 1 shows the relationship between the substrate temperature and the breakdown voltage of the gate oxide film. As shown in FIG. 1, when the titanium nitride film is formed at a substrate temperature of about 500° C., the breakdown voltage of the gate oxide film decreases with a high probability. Thus, when the film formation temperature of the titanium nitride film increases, the breakdown voltage of the gate oxide film decreases.

More specifically, when the titanium nitride film is formed at a high temperature, it receives a large tensile stress, and a force having the same magnitude as the tensile stress but in an opposite direction to it is generated in the substrate due to the law of action and reaction. This force is assumed to act on the gate oxide film, thus decreasing the breakdown voltage of the gate oxide film.

Therefore, a method of forming a titanium nitride film, with which a stress generated during film formation is small so that the breakdown voltage of the gate oxide film will not decrease, is sought for.

SUMMARY OF THE INVENTION

The present invention has been made in consideration of the above problems in the prior art, and has as its object to provide a method of manufacturing a semiconductor device having a titanium polycide film in which a titanium nitride film, which does not affect the breakdown voltage of the gate oxide film and which has a high barrier performance, is intervened.

In order to achieve the above object, according to the main aspect of the present invention, there is provided a method of manufacturing a semiconductor device, comprising, in a method of forming a metal polycide film obtained by forming a metal silicide film on a polysilicon film, the step of forming a barrier layer made of metal nitride between the polysilicon film and the metal silicide film by collimate sputtering.

In the manufactured semiconductor device, the force that acts during formation of the barrier film layer decreases, and the stress acting on a gate oxide film can be decreased, so that a decrease in breakdown voltage of the gate oxide film can be prevented. The manufactured semiconductor device has an excellent heat resistance, and can obtain high isolation between the polysilicon film and the metal silicide film. Even when annealing is performed, impurity diffusion from the polysilicon film to metal silicide can be prevented.

The barrier layer made of metal nitride is formed within a substrate temperature range of not less than 400° C. and not more than 600° C. by collimate sputtering.

As the metal nitride, either one of titanium nitride, tungsten nitride, and tantalum nitride is used.

The metal silicide is titanium silicide, and titanium silicide is formed by sputtering using a titanium silicide alloy as a sputter target.

Furthermore, the titanium nitride film is formed in a nitrogen-containing atmosphere using titanium as a sputter target, and this atmosphere contains Ar gas and $N_2$ gas at a flow rate ratio of 1:4.

More specifically, there is provided a method of manufacturing a semiconductor device, comprising the steps of forming a gate oxide film on a silicon substrate, forming a polysilicon film on the gate oxide film, forming a titanium nitride film on the polysilicon film by collimate sputtering at a substrate temperature of 400° C. to 600° C., and forming a metal silicide film on the titanium nitride film.

Conventionally, collimate sputtering is used for increasing coverage to a contact hole having a high aspect ratio by, e.g., forming Ti/TiN barrier metal prior to burying tungsten (W) in the contact hole. According to the present invention, collimate sputtering is used for forming a barrier layer with a metal polycide, so that a decrease in breakdown voltage of the gate oxide film can be prevented.

In this manner, according to the present invention, a low-stress barrier layer made of a metal nitride is formed between the polysilicon film and the metal silicide film by collimate sputtering. As a result, a good semiconductor device, the breakdown voltage of the gate oxide film of which is not decreased, can be manufactured.

When low-damage, heat-resistant titanium polycide using a metal nitride barrier made of titanium nitride or the like is applied to a DRAM, low-resistance word lines can be formed, so that a highly integrated DRAM having a small chip size can be obtained.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF THE PREFERRED EMBODIMENT

A method of manufacturing a semiconductor device according to one preferable embodiment of the present invention will be described with reference to the accompanying drawings.

FIGS. 2A to 2F are sectional views respectively showing a method of manufacturing a semiconductor device according to an embodiment of the present invention in the order of its main manufacturing steps.

Figure 1:
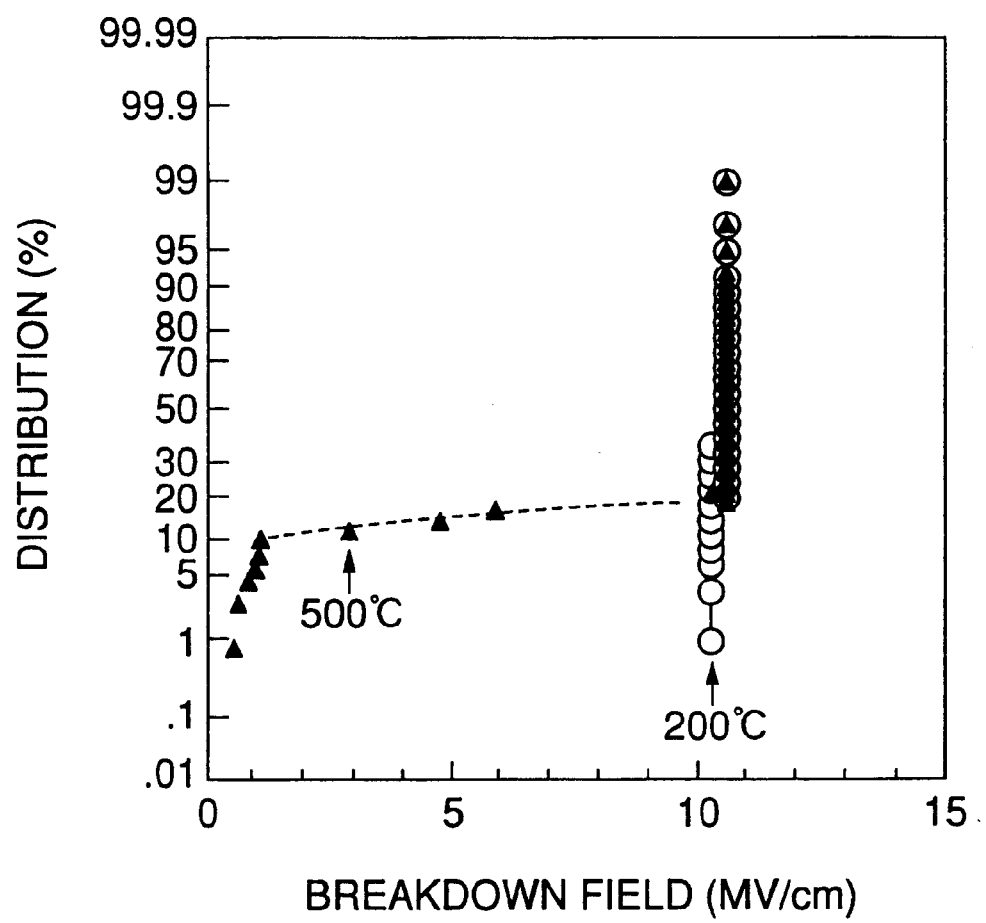
FIG. 1 is a graph showing the film formation temperature dependency of the distribution of the breakdown voltage of the gate oxide film in conventional, ordinary sputtering.
Figure 2A:
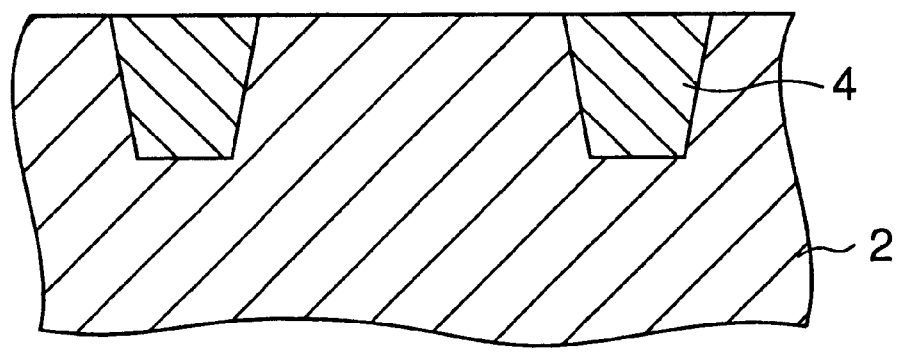
FIGS. 2A to 2F are sectional views respectively showing a method of manufacturing a semiconductor device according to an embodiment of the present invention in the order of its main manufacturing steps.
Figure 2B:
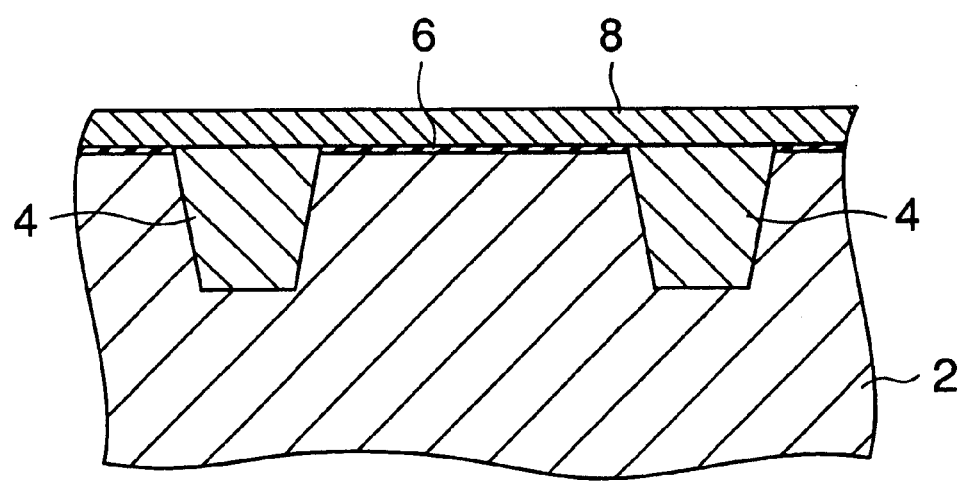

As shown in FIG. 2A, an element isolation region 4 for defining an element formation region is formed in a silicon substrate 2. As shown in FIG. 2B, silicon on the upper surface of the element formation region is oxidized, to form, e.g., a 7-nm thick gate oxide film 6 on the upper surface of the defined element formation region. After that, a phosphorus-doped 70-nm thick polysilicon film 8 is formed on the gate oxide film 6.

Figure 2C:
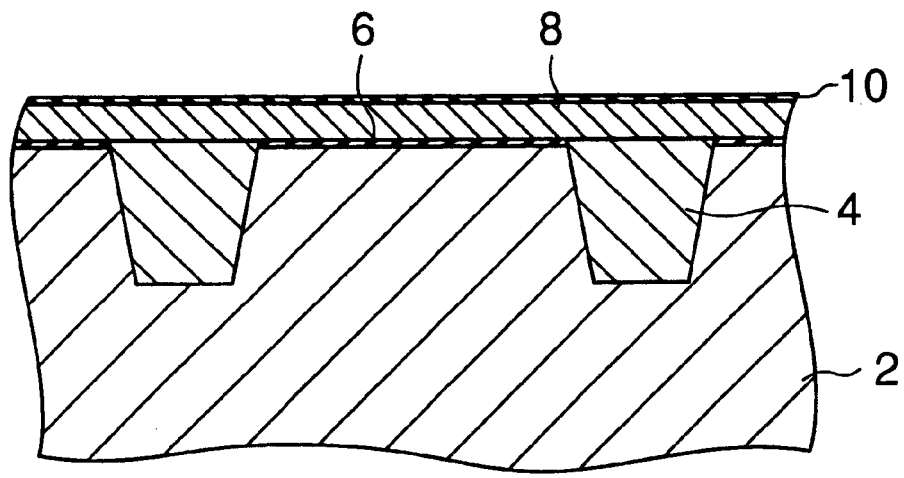
Figure 3:
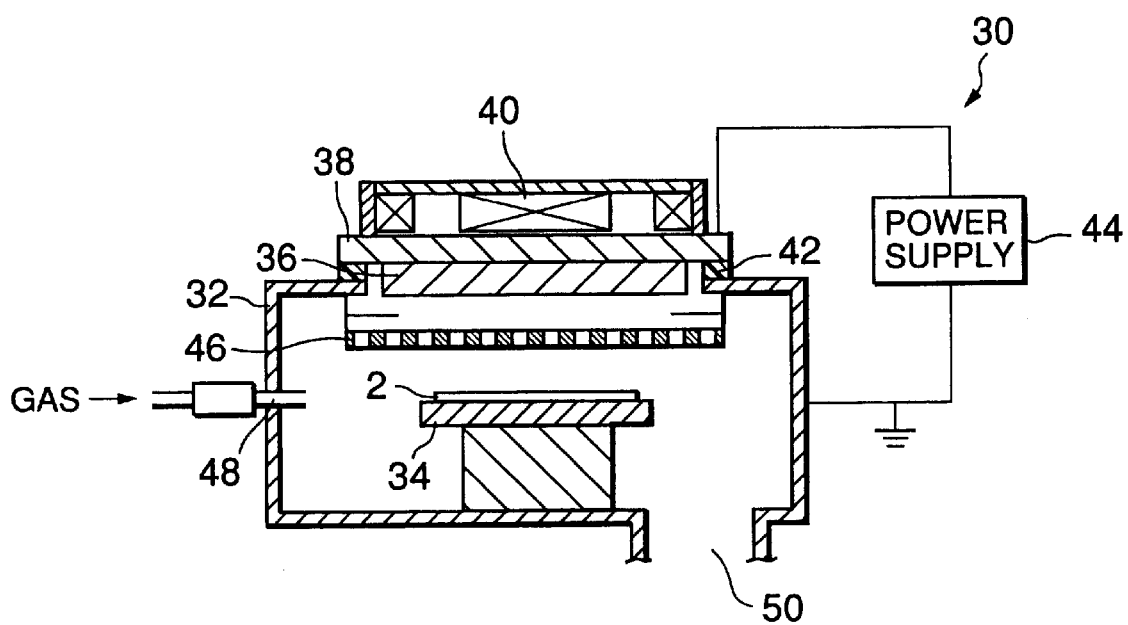
FIG. 3 is a sectional view showing the schematic overall arrangement of a collimate sputtering apparatus employed in the present invention.

By employing a collimate sputtering apparatus 30 shown in FIG. 3, titanium is used as a sputter target to form a titanium nitride film 10 on the polysilicon film 8 by reactive sputtering in a nitrogen atmosphere (see FIG. 2C).

The thickness of the titanium nitride film 10 is set between 3 nm and 30 nm. If the titanium nitride film 10 is thinner than 3 nm, titanium nitride will not exist in the form of a film but forms islands, so a barrier performance cannot be obtained. If the titanium nitride film 10 is thicker than 30 nm, titanium nitride has a high resistance, and an increase in resistivity of the gate electrode as a whole becomes non-neglectable. The preferable thickness of the titanium nitride film 10 is 10 nm.

Figure 4:
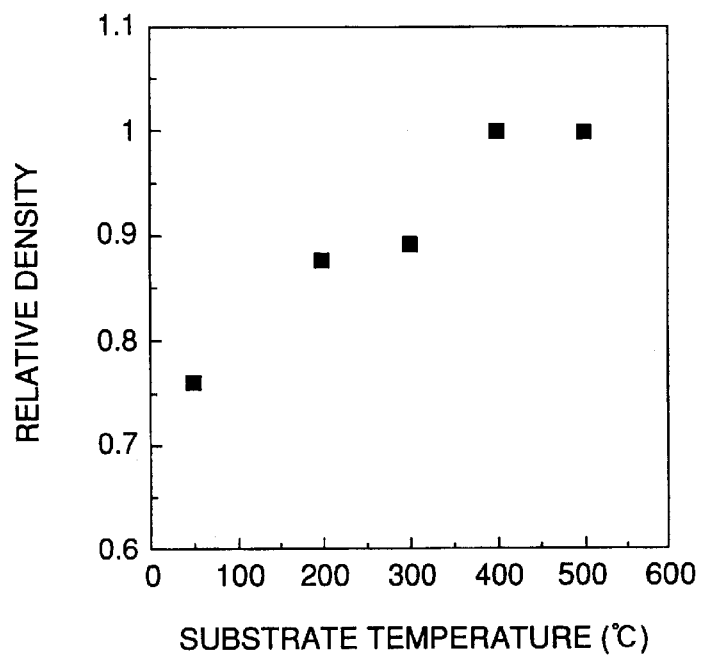
FIG. 4 is a graph showing the relationship between the relative density and film formation temperature of titanium nitride.

The temperature (substrate temperature) of the silicon substrate 2 for formation of the titanium nitride film 10 is set to 400° C. to 600° C. When the titanium nitride film is formed by heating the silicon substrate 2 to a temperature of 400° C. or more, a stable, sufficiently high, and constant value can be obtained as the relative density of the titanium silicide film 2, as shown in FIG. 4. Then, the density of the titanium nitride film 10 can be increased, and the barrier performance of the TiN film against the impurity can be improved. The substrate temperature is set to 600° C. or less because, if it is higher than 600° C., stable operation of the sputtering apparatus is difficult to achieve. If the difficulty in operation is not considered, the upper-limit temperature may be 600° C. or more. FIG. 4 shows the relative density of the titanium nitride film with reference to the relative density, obtained when the substrate temperature for film formation is 500° C., as 1.

Other sputtering conditions are set as follows:

| | |
|---|---|
| Gas pressure | 3 mTorr |
| Ar flow rate: $N_2$ flow rate | 1:4 |
| Sputter power | 9 kW |

Figure 2D:
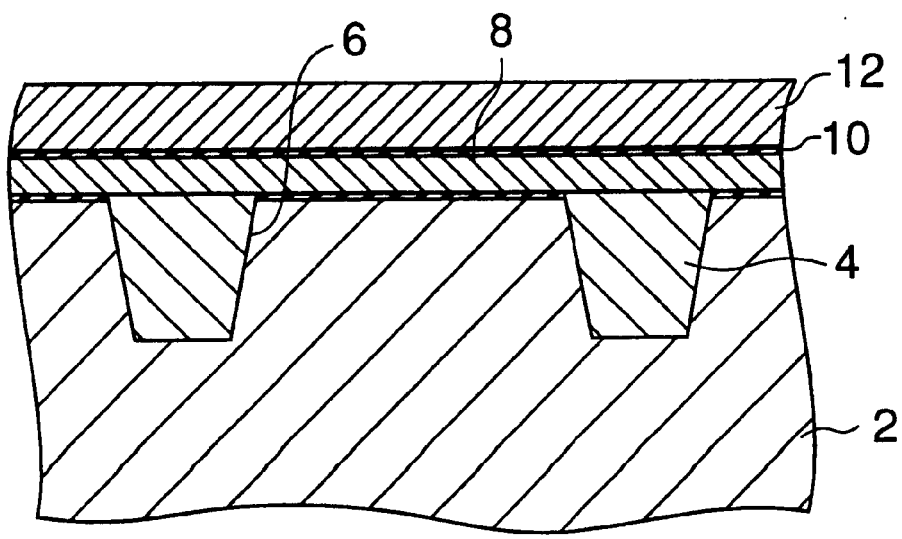

Subsequently, as shown in FIG. 2D, a 100-nm thick titanium silicide film 12 is formed on the titanium nitride film 10 by sputtering using a titanium silicide alloy as a sputter target. As the film formation conditions of the titanium silicide film 12, the Ar pressure was set to 7 mTorr, and the sputtering power was set to 5 kW.

When the titanium silicide film 12 is formed by sputtering, it is amorphous. This amorphous titanium silicide is crystallized by, e.g., RTA (Rapid Thermal Annealing) at 850° C. for 10 sec, to decrease its resistance. Crystallization is performed at this stage because, once titanium silicide is formed into thin wires such as word lines, crystallization of amorphous titanium silicide is difficult to perform.

Figure 2E:
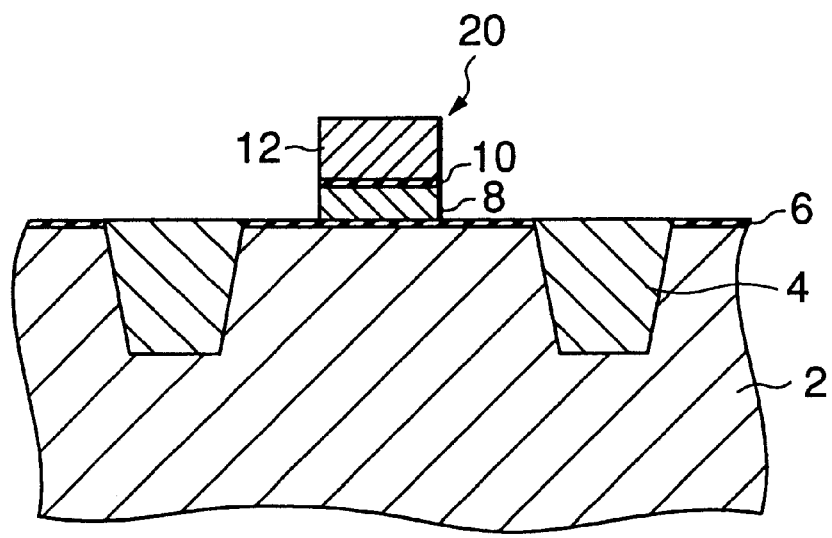

As shown in FIG. 2E, the titanium silicide film 12, titanium nitride film 10, and polysilicon film 8 are patterned by lithography and anisotropic dry etching, to form a gate electrode 20.

Figure 2F:
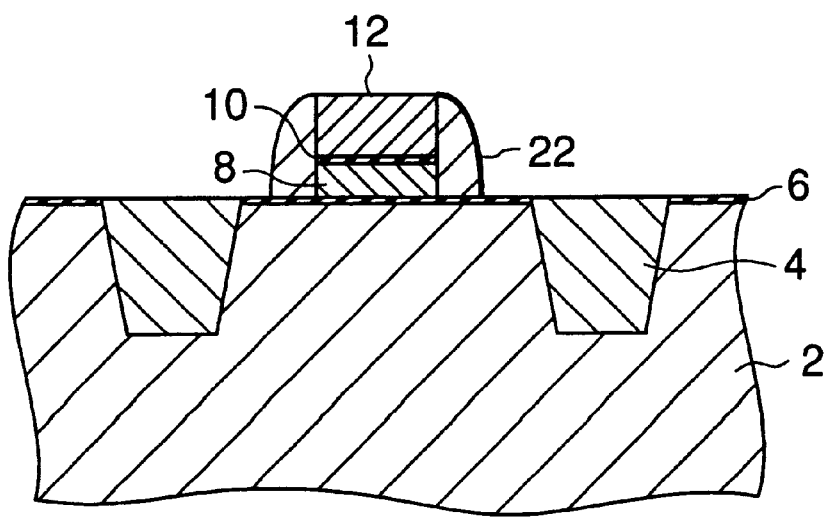

As shown in FIG. 2F, a silicon oxide film is formed on the entire surface of the device by CVD. This silicon oxide film is then etched back by anisotropic dry etching to form a side wall 22 on the side wall of the gate electrode 20.

The stress generated by formation of the titanium nitride film can be reduced through the above steps. Therefore, a titanium nitride film providing a high breakdown voltage for the gate oxide film and excellent in the barrier performance can be formed. As a result, even if the titanium nitride film is subjected to high-temperature annealing in the DRAM manufacturing process, a titanium polycide gate electrode, the layer resistance of which does not increase, can be formed.

As shown in FIG. 3, the collimate sputtering apparatus 30 used in the present invention has a substrate holder 34 in a chamber 32 to hold a semiconductor substrate (silicon substrate 2), and a metal target 36 located above the substrate holder 34. The metal target 36 is fixed to a backing plate 38, and a magnet 40 is set above the backing plate 38. The backing plate 38 is attached to the chamber 32 through an insulator 42, and a voltage from a power supply 44 is applied across the backing plate 38 and chamber 32. Furthermore, a collimator 46 having a plurality of vertical holes is set between the metal target 36 and the semiconductor substrate. Reference numeral 48 denotes a gas inlet port; and 50, an exhaust port.

In the above sputtering conditions, the flow rate of $N_2$ is increased when compared to a case wherein a silicon substrate is sputtered without heating. Thus, even at a high temperature at which the gas absorption amount on the surface of the substrate is small, titanium is sufficiently nitrided, so that stoichiometric titanium nitride can be generated. The sputtering power is increased when compared to a case wherein titanium nitride is formed in accordance with ordinary sputtering. Hence, even with the collimate sputtering apparatus 30 having a low film formation speed per unit power, a high film formation rate can be obtained.

In this manner, when the titanium nitride film 10 is formed on the polysilicon film 8 at a high substrate temperature by using the collimate sputtering apparatus 30, as the titanium nitride film 10 has a high density as shown in FIG. 4, the impurity is highly blocked, while the stress acting on the titanium nitride film 10 is small. More specifically, the force acting on the gate oxide films 6 is small, so that a decrease in breakdown voltage of the gate oxide films 6 can be prevented.

The sputtering dependency of the distribution of the breakdown voltage of the gate oxide film in high-temperature film formation as in the present invention will be described.

Figure 5:
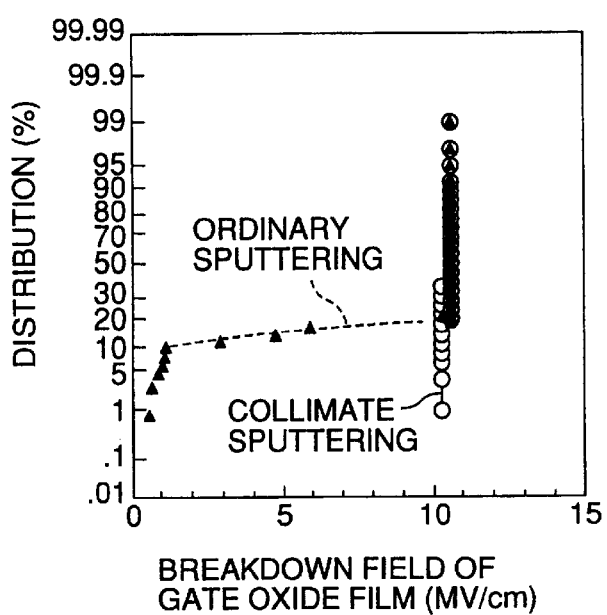
FIG. 5 is a graph showing the sputtering dependency of the distribution of the breakdown voltage of the gate oxide film in high-temperature film formation.

As shown in FIG. 5, in conventional ordinary sputtering, the breakdown field at about 6 MV/cm is 10% to less than 20%, whereas collimate sputtering of the present invention is performed mostly at 10 MV/cm. In addition, since the film formation temperature is set between 400° C. or more and 600° C. or less, the film density can be increased, so that a metal nitride having a high barrier performance can be realized.

In the above embodiment, the titanium nitride film is formed between the titanium silicide film and the polysilicon film. Note that in the present invention, the barrier layer need not be limited to a titanium nitride film, but a metal nitride film such as a tungsten nitride film or a tantalum nitride film may be formed and used as the barrier layer.

What is claimed is:

1. A method of manufacturing a semiconductor device, comprising, in a structure obtained by forming a metal silicide film on a polysilicon film, forming a barrier layer made of a metal nitride between said polysilicon film and said metal silicide film by collimate sputtering.

2. A method according to claim 1, wherein said barrier layer is formed at a substrate temperature of not less than 400° C.

3. A method according to claim 1, wherein said barrier layer is formed at a substrate temperature of not more than 600° C.

4. A method according to claim 1, wherein the metal nitride is titanium nitride.

5. A method according to claim 1, wherein the metal nitride is tungsten nitride.

6. A method according to claim 1, wherein the metal nitride is tantalum nitride.

7. A method according to claim 1, wherein the metal silicide is titanium silicide.

8. A method according to claim 7, wherein the titanium silicide is formed by sputtering using a titanium silicide alloy as a sputter target.

9. A method according to claim 4, wherein the titanium nitride is formed in a nitrogen-containing atmosphere using titanium as a sputter target.

10. A method according to claim 9, wherein the nitrogen-containing atmosphere contains Ar gas and $N_2$ gas as components, and a flow rate ratio of the Ar gas to the $N_2$ gas is 1:4.

11. A method according to claim 8, comprising the step of patterning the metal silicide and the step of annealing the titanium silicide, the step of annealing the titanium silicide being performed prior to patterning metal polycide.

12. A method of manufacturing a semiconductor device, comprising the steps of forming a gate oxide film on a silicon substrate, forming a polysilicon film on said gate oxide film, forming a titanium nitride film on said polysilicon film by collimate sputtering, and forming a metal silicide film on said titanium nitride film.

13. A method according to claim 12, wherein said titanium nitride film is formed at a substrate temperature of not less than 400° C.

14. A method according to claim 12, wherein said titanium nitride film is formed at a substrate temperature of not more than 600° C.

15. A method according to claim 1, wherein said semiconductor device is applied to a DRAM.

16. A method according to claim 12, wherein said semiconductor device is applied to a DRAM.

17. A method according to claim 1, wherein formation of said barrier layer is formation of a barrier metal of a MOS transistor having a polycide gate structure.

18. A method according to claim 12, wherein formation of said titanium nitride film is formation of a barrier metal of a MOS transistor having a polycide gate structure.

* * * * *